United States Patent
Masuda et al.

(10) Patent No.: US 9,164,652 B2
(45) Date of Patent: Oct. 20, 2015

(54) ENERGY MANAGEMENT ASSISTANCE DEVICE, ENERGY MANAGEMENT ASSISTANCE SYSTEM, AND PROGRAM

(75) Inventors: Rikiya Masuda, Osaka (JP); Kiyotaka Takehara, Nara (JP); Yoshitaka Tezuka, Osaka (JP); Kenji Nakakita, Osaka (JP); Akiko Okamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 170 days.

(21) Appl. No.: 13/984,149

(22) PCT Filed: Mar. 8, 2012

(86) PCT No.: PCT/JP2012/055910
§ 371 (c)(1),
(2), (4) Date: Aug. 7, 2013

(87) PCT Pub. No.: WO2012/121315
PCT Pub. Date: Sep. 13, 2012

(65) Prior Publication Data
US 2013/0318462 A1    Nov. 28, 2013

(30) Foreign Application Priority Data

Mar. 8, 2011    (JP) .................................. 2011-050557

(51) Int. Cl.
*G06F 3/048* (2013.01)
*G06F 3/0481* (2013.01)
(Continued)

(52) U.S. Cl.
CPC .......... *G06F 3/0481* (2013.01); *H04N 21/4131* (2013.01); *H04N 21/43615* (2013.01);
(Continued)

(58) Field of Classification Search
CPC .......................... H04N 21/4131; G06F 3/0481
USPC ........................................................ 715/771
See application file for complete search history.

(56) References Cited

U.S. PATENT DOCUMENTS 7,774,415 B2 * 8/2010 Katou ........................... 709/206
8,515,878 B2 * 8/2013 Radloff et al. ................ 705/412
(Continued)

FOREIGN PATENT DOCUMENTS

JP    2001-356814 A    12/2001
JP    2004-086864 A    3/2004
(Continued)

OTHER PUBLICATIONS

Supplementary European Search Report for corresponding European Application No. 12754957.4 dated Aug. 1, 2014.
(Continued)

*Primary Examiner* — William Titcomb
(74) *Attorney, Agent, or Firm* — Renner. Otto, Boisselle & Sklar, LLP

(57) ABSTRACT

An object is to allow intuitively understand whether display information displayed on a display device indicates favorable state or unfavorable state for a user. An acquisition unit 11 acquires energy-related information. A communication unit 13 is connected to a display device 3 and an operation device 4. Display information to be displayed on the display device 3 has a stratum structure including first display information as a top tier and second display information, the first display information including at least two categories which express the favorability about the energy-related information, the second display information including plural kinds of information so that the lower tier includes more detailed information. An information generation unit 14 transmits second display information to the display device 3 upon receiving a request from the operation device 4 when first display information is displayed on the display device 3.

10 Claims, 3 Drawing Sheets

(51) Int. Cl.
*H04N 21/41* (2011.01)
*H04N 21/436* (2011.01)
*H04N 21/488* (2011.01)
*H04N 21/442* (2011.01)
*H04N 21/443* (2011.01)
*G06Q 50/06* (2012.01)
*G01R 22/10* (2006.01)

(52) U.S. Cl.
CPC ....... *H04N21/4424* (2013.01); *H04N 21/4436* (2013.01); *H04N 21/4882* (2013.01); *G01R 22/10* (2013.01); *G06Q 50/06* (2013.01); *G09G 2330/021* (2013.01); *G09G 2354/00* (2013.01)

(56) References Cited

U.S. PATENT DOCUMENTS 8,886,361 B1 * 11/2014 Harmon et al. ............... 700/291

2007/0203860 A1  8/2007 Golden et al.
2009/0157529 A1 * 6/2009 Ehlers et al. .................. 705/26
2010/0318200 A1  12/2010 Foslien et al.

FOREIGN PATENT DOCUMENTS

JP  2009-047682 A  3/2009
JP  2010-128617 A  6/2010

OTHER PUBLICATIONS

International Search Report for corresponding International Application No. PCT/JP2012/055910 mailed Jun. 12, 2012.
Form PCT/ISA/237 for corresponding International Application No. PCT/JP2012/055910 dated Jun. 12, 2012.

* cited by examiner

ENERGY MANAGEMENT ASSISTANCE DEVICE, ENERGY MANAGEMENT ASSISTANCE SYSTEM, AND PROGRAM

TECHNICAL FIELD

The invention relates to: an energy management assistance device that visualizes an energy consumption condition, thereby assisting management of the energy; an energy management assistance system including the energy management assistance device; and a program product designed to operate a computer as the energy management assistance device.

BACKGROUND ART

There has been proposed a device which is capable of displaying information such as attainment level of targets about use of energy (e.g., electricity) and contribution to energy saving, on a screen device (e.g., see JP2009-47682A).

However, this kind of device has problems that: the device displays the information stereotypically (uniformly); and it is elusive for a user to understand whether the information indicates favorable state or unfavorable state.

DISCLOSURE OF THE INVENTION

It is an object of the invention to provide: an energy management assistance device that enables a user to intuitively understand whether the display information displayed on a display device indicates favorable state (benefit) or unfavorable state (loss) for the user; an energy management assistance system including the energy management assistance device; and a program product designed to operate a computer as the energy management assistance device.

An energy management assistance device of the invention includes: an acquisition unit configured to acquire energy-related information; a communication unit to be connected to a display device and an operation device; and an information generation unit configured to generate display information to be displayed on the display device. The display information has a stratum structure including first display information as a top tier and second display information, the first display information including at least two categories which express the favorability about the energy-related information, the second display information including plural kinds of information so that the lower tier includes more detailed information. The information generation unit has functions of: transmitting first display information to the display device when the energy-related information acquired by the acquisition unit meets a predetermined rule; and transmitting second display information to the display device upon receiving operation information for requesting second display information from the operation device when first display information is displayed on the display device.

In the energy management assistance device, it is preferable that the information generation unit has functions of: making a decision about whether the energy-related information acquired by the acquisition unit indicates favorable state or unfavorable state; and determining a level of the energy-related information based on plural levels prescribed by a predefined level determination rule. The information generation unit is configured to use, as the first display information, the information concerning the level of the energy-related information in addition to the information concerning whether the energy-related information indicates favorable state or unfavorable state.

According to the energy management assistance device, it is preferable to further include a storage unit for storing plural kinds of second display information. The information generation unit is configured, if a plurality kinds of displayable second display information are stored in the storage unit when receiving operation information for requesting second display information from the operation device under a condition where first display information is displayed on the display device, to select one kind of second display information from the storage unit to transmit it to the display device in accordance with a priority determined based on past display history of second display information.

According to the energy management assistance device, it is preferable to further include a storage unit for storing display information generated by the information generation unit. The information generation unit is configured, if pluralities of displayable display information are stored in the storage unit on an occasion of transmitting first display information to the display device, to select one of display information from the storage unit in accordance with a priority determined based on past display history of second display information to transmit first display information of the selected display information to the display device.

According to the energy management assistance device, it is preferable that the information generation unit is configured to generate a first type of display information and a second type of display information with respect to a same energy-related information. Each of the first type of display information and the second type of display information has a stratum structure including first display information as a top tier and second display information, the first display information including at least two categories which express the favorability about the energy-related information, the second display information including plural kinds of information so that the lower tier includes more detailed information. The energy management assistance device further includes a storage unit for storing the first type of display information and the second type of display information generated by the information generation unit. The information generation unit is configured, if a plurality types of display information are stored in the storage unit on an occasion of transmitting first display information to the display device, to preferentially select a type of display information which is different from a type of display information displayed last time based on past display history of second display information, and to transmit first display information of the selected type of display information.

According to the energy management assistance device, it is preferable that visually different symbols are associated with the respective levels of the first display information.

According to the energy management assistance device, it is preferable that the levels of the first display information are expressed by the number of the symbols.

According to the energy management assistance device, it is preferable that the energy-related information has a form of a numerical value about the energy. The energy management assistance device further includes: a target value storage unit; and a target value setting unit configured to set a target value about the energy-related information into the target value storage unit in response to operation information from the operation device. The information generation unit is configured to determine the favorability about the energy-related information based on whether the energy-related information exceeds the target value.

According to the energy management assistance device, it is preferable to use a television set as the display device. The information generation unit is configured to transmit the first display information to the display device so that the first display information is shown on a part of a screen of the display device.

An energy management assistances system of the invention includes: an information provision device configured to provide energy-related information; a display device configured to make a display in response to inputted display information; an operation device configured to generate operation information in response to manipulation of a user; and an energy management assistance device connected to the information provision device, the display device and the operation device. The energy management assistance device includes: an acquisition unit configured to acquire energy-related information from the information provision device; a communication unit connected to the display device and the operation device; and an information generation unit configured to generate display information to be displayed on the display device. The display information has a stratum structure including first display information as a top tier and second display information, the first display information including at least two categories which express the favorability about the energy-related information, the second display information including plural kinds of information so that the lower tier includes more detailed information. The information generation unit has functions of: transmitting first display information to the display device when the energy-related information acquired by the acquisition unit meets a predetermined rule; and transmitting second display information to the display device upon receiving operation information for requesting second display information from the operation device when first display information is displayed on the display device.

A program product of the invention includes machine readable instructions which when executed by a computer to serve it as an energy management assistance device. The energy management assistance device includes: an acquisition unit configured to acquire energy-related information; a communication unit to be connected to a display device and an operation device; and an information generation unit configured to generate display information to be displayed on the display device. The display information has a stratum structure including first display information as a top tier and second display information, the first display information including at least two categories which express the favorability about the energy-related information, the second display information including plural kinds of information so that the lower tier includes more detailed information The information generation unit has functions of: transmitting first display information to the display device when the energy-related information acquired by the acquisition unit meets a predetermined rule; and transmitting second display information to the display device upon receiving operation information for requesting second display information from the operation device when first display information is displayed on the display device.

The invention is configured to show the display information on the display device using at least two categories which express the favorability about the energy-related information. It is accordingly enabling a user to intuitively understand whether the display information indicates favorable information (benefit) or unfavorable information (loss).

BRIEF DESCRIPTION OF THE DRAWINGS

Preferred embodiments of the invention will now be described in further details. Other features and advantages of the present invention will become better understood with regard to the following detailed description and accompanying drawings where.

BEST MODE FOR CARRYING OUT THE INVENTION

Figure 1:
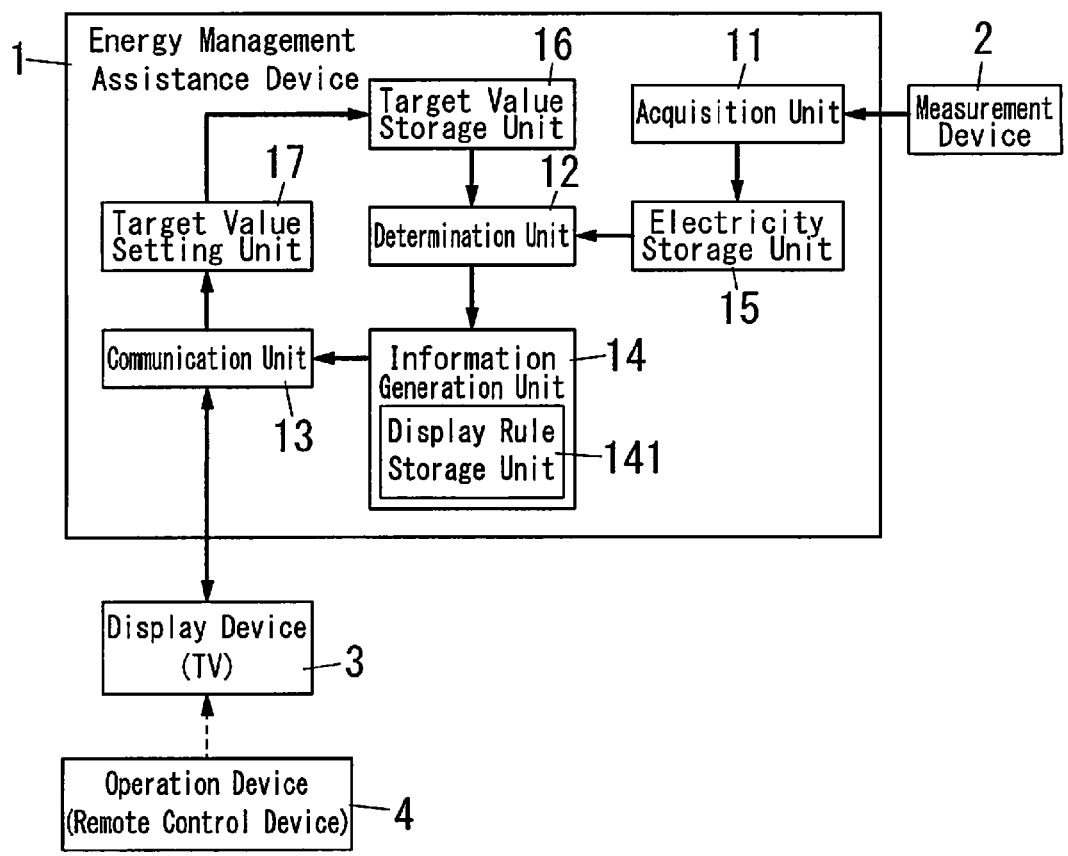
FIG. 1 is a block diagram illustrating a first embodiment and a second embodiment.
Figure 2:
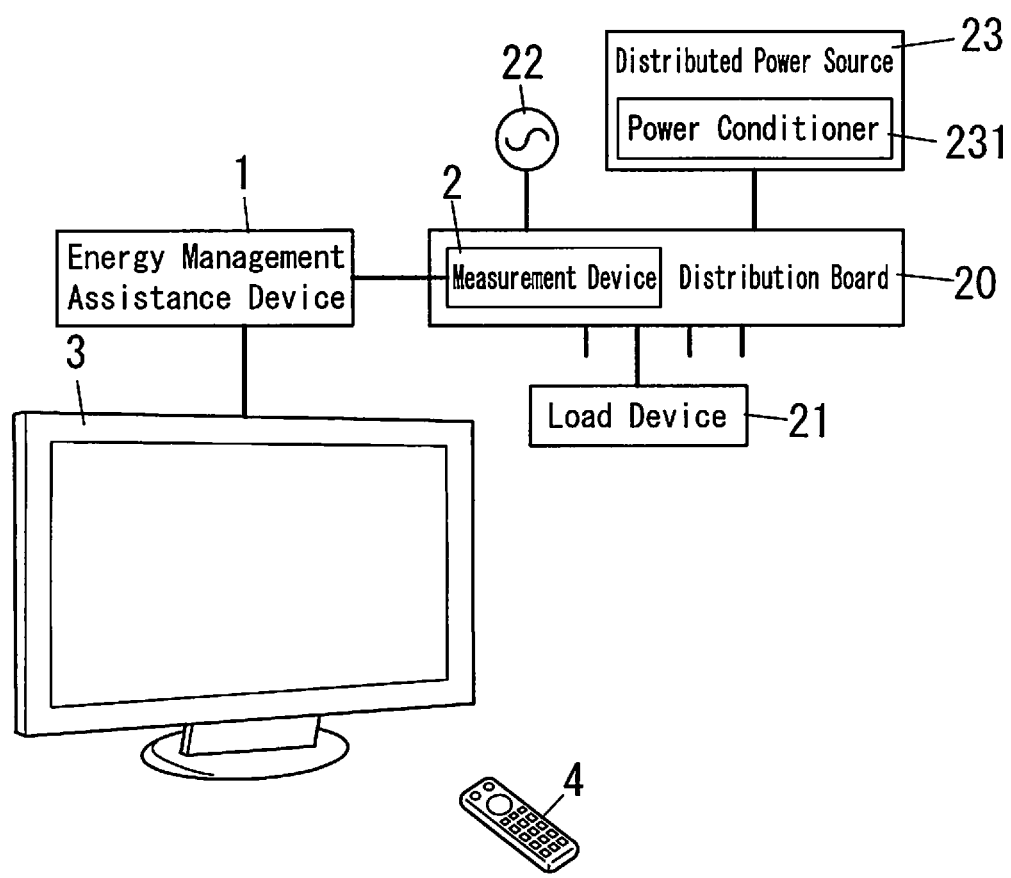
FIG. 2 is a block diagram illustrating a whole configuration of the first embodiment and the second embodiment.

Embodiments are explained below with using "electric energy" as an example of "energy", but the embodiments are not limited thereto. The technical thought of the following description can be applied to a supply medium other than electricity, as long as energy-related information of the supply medium is obtainable. Energy-related information may include various kinds of information related to energy, such as: usage amount e.g., supply, consumption and production, of the energy; unit purchase price of the energy; change of supply source of the energy; and the like. Examples of this kind of supply medium include: city gas supplied through a gas pipe; propane gas supplied through a gas tank; and water supplied through a water pipe.

In the following embodiments, electric energy is supplied to a load device 21 from a commercial power source 22 of power grid and a distributed power source 23. A solar power generation device is exemplified as the distributed power source 23. The solar power generation device includes a power conditioner 231 that is configured to convert a DC (direct current) power from a solar cell (not shown) into a required power to the load device 21.

In the illustrated example, each of the commercial power source 22 and the distributed power source 23 is configured to supply electricity to the load device 21 through a distribution board 20. The power grid and the distributed power source 23 are interconnected in the distribution board 20, and therefore the distributed power source 23 is allowed to flow back electricity to the power grid if the distributed power source 23 has some margin of power generation with respect to consumed energy in the load device 21.

The distribution board 20 includes a built-in measurement device 2 which measures: the electricity purchased from the commercial power source 22; the electricity generated by the distributed power source 23; and the electricity supplied to the load device 21. The measurement device 2 of the embodiments is constituted by an electronic electricity meter, and has functions of: detecting voltage value and current value of a particular position; calculating an instantaneous value of electricity using the detected voltage value and the detected current value; and calculating an integration value of electricity per predetermined time period (i.e., a value of electricity per the predetermined time period) by integrating (accumulating) the instantaneous value(s).

Time period for obtaining the electricity is determined arbitrarily, and may be five minutes. The measurement device 2 transmits the value of electricity amount obtained in a five minutes unit, and uses this value of electricity as the instantaneous value. Note that, the measurement device 2 may be configured to calculate an electric power value using the detected voltage and the detected current at a detection time point, and to transmit the calculated value as the instantaneous value. By accumulating instantaneous values, value of electricity related to a time period longer than five minutes (i.e., integration value) can be obtained. The integration value for a certain period (e.g., integration value for five minutes, in the above example) is obtained in the measurement device 2. Note that, an energy management assistance device 1 (described in detail later) may be configured to obtain the integration value from instantaneous values. The measurement device 2 is regarded as an example of an information provision device for providing energy-related information to the energy management assistance device 1. Examples of the information provision devices include a device that is configured to acquire energy-related information such as electricity prices (unit price of the electricity) through a public network such as world-wide-web.

The measurement device 2 is not necessarily required to be housed in the distribution board 20. The measurement device 2 may be provided outside of the distribution board 20. The measurement device 2 may include a current sensor using Rogowski coil, toroidal coil, or the like.

The following example includes the measurement device 2 as "information provision device", and uses an instantaneous value or an integration value of electricity transmitted by the measurement device 2 as "energy-related information". Because the measurement device 2 measures: the electricity purchased from the power grid; the electricity generated by the distributed power source 23; and the electricity consumed by the load device 21, it can calculate the amount of electricity flown back to the power grid, using the values of the electricity. In a simplest way, obtained value by subtracting "the amount of consumed energy by the load device" from "the amount of the electricity generated by the distributed power source 23" may be regarded as the amount of the flown back electricity, if the obtained value is positive. Note that, the distributed power source 23 may further include a storage battery. In this configuration, the measurement device 2 may be configured to measure the charged/discharged electricity in the storage battery.

The instantaneous value/integration value of electricity outputted from the measurement device 2 is inputted into the energy management assistance device 1. The energy management assistance device 1 transmits display information to a display device 3. The display information means such information that is displayed on a screen of the display device 3 for informing the energy-related information to a user. The display information may include, if there is set a target about the energy-related information, information concerning a result of success or failure, attainment level, of the target. The display information may include, if there is not set a target, information concerning usage amount of the energy, time point when supply source of the energy is changed, and the like. The energy-related information may include not only reception or supply of electricity with regard to the commercial power source 22, the load device 21 and the distributed power source 23, but also electric bill of the commercial power source 22, power generation amount of the distributed power source 23, and the like. The display information is described in detail later.

Hereinafter, the energy management assistance device 1 is referred simply to as "management device 1". The display device 3 may be constituted by: a purpose-built screen device; an intercom device with a screen; a control panel of a home-network system; or a television set with a data-transmission connector such as a LAN connector or a HDMI connector. The control panel is a component of the home-network system, and has a touch panel. The control panel is used as an operation/display device of the home-network system.

As described above, various kinds of device can be used for the display device 3. The embodiment explained below includes a television set with a data-transmission connector (hereinafter, referred to as "TV") as the display device 3. The TV 3 has functions of: receiving a wireless signal from a remote control device 4; and transmitting, in response to a manipulation of the remoter control device 4, operation information that corresponds to the manipulation of the remote control device 4 through the data-transmission connector. The remote control device 4 therefore serves as an operation device manipulated by a user. Instruction by the operation information, which is transmitted from the TV 3 in response to manipulation of the remote control device 4 by a user, depends not only on locations of the manipulated button of the remote control device 4 (e.g., which button is pushed by a user), but also on the contents displayed on the screen of the TV 3. Usually, the display device 3 uses a single connector both for receiving display information (from the management device 1) and transmitting operation information (to the management device 1) in response to the operation of the remote control device 4 as the operation device 4. However, the embodiment is not limited thereto, and different connectors may be used for display information and for operation information.

First Embodiment

A management device is described in detail below. As shown in FIG. 1, the management device 1 includes an acquisition unit 11 configured to acquire from the measurement device 2 an instantaneous value or an integration value of electricity as energy-related information; and a determination unit 12 configured to make a decision about whether the energy-related information meets a predetermined triggering condition, using the instantaneous value or the integration value acquired by the acquisition unit 11. The management device 1 further includes: a communication unit 13 as an interface to which the TV 3 is connected; and an information generation unit 14 configured to generate display information which is to be displayed on the screen of the TV 3. The communication unit 13 transmits display information to the TV 3, and receives operation information from the TV 3 when the remote control device 4 is manipulated. The information generation unit 14 transmits, when a value related to electricity acquired by the acquisition unit 11 meets a triggering condition, display information to the TV 3 according to a display rule (described in detail later).

The management device 1 includes an electricity storage unit 15. The instantaneous value or the integration value of electricity acquired by the acquisition unit 11 is stored in the electricity storage unit 15 with corresponding time o'clock. In the embodiment, the acquisition unit 11 is configured to acquire amount of electricity for five minutes as "instantaneous value of electricity". "Integration value of electricity" is obtained by the acquisition unit 11 by accumulating instantaneous values. The acquisition unit 11 may be configured to obtain various forms of "integration value of electricity" with respect to various kinds of "periods". For example, the acquisition unit 11 may be configured to calculate "integration value for one day", "integration value for one week", "integration value for one month", "integration value for one year", and the like. In the embodiment, the electricity storage unit 15 stores the instantaneous value of electricity acquired by the acquisition unit 11, and the integration value of electricity calculated by the acquisition unit 11. The electricity storage unit 15 stores the instantaneous values and integration values of electricity with a corresponding date and time, as shown in Table 1.

TABLE 1

| date | time | integration value [kWh] | instantaneous value [kW] |
|---|---|---|---|
| Feb. 1, 2011 | 0:00 | 0 | ... |
| | 0:05 | 0 | ... |
| | ... | ... | ... |
| | 23:50 | 20 | ... |
| | 23:55 | 21 | ... |
| Feb. 2, 2011 | 0:00 | 21 | ... |
| | ... | ... | ... |
| | 23:50 | 32 | ... |
| | 23:55 | 34 | ... |
| ... | ... | ... | ... |
| Feb. 27, 2011 | 0:00 | 493 | ... |
| | ... | ... | ... |
| | 23:50 | 501 | ... |
| | 23:55 | ... | ... |

The triggering condition for the energy-related information used in the determination unit 12 can be determined arbitrarily. In the following embodiment, the determination unit 12 is configured to compare the measured electricity value (i.e., instantaneous value or integration value) with a predetermined target value, and use the relation between the measured electricity value and the target value for the triggering condition. Examples of the triggering condition include: a condition that a measured instantaneous value of electricity exceeds a target value; a condition of coming to a predetermined date and time; and the like.

The management device 1 includes a target value storage unit 16 for storing a target value. For example, the target value storage unit 16 stores target values with respect to various kinds of triggering conditions, as shown in Table 2. In the example shown in Table 2, the target value storage unit 16 is capable of being set therein target values respectively with regard to items of: upper limit of integration value for one day; upper limit of integration value for one week; upper limit of integration value for one month; upper limit of instantaneous value; and the like. In the example shown in Table 2, the target value about upper limit of integration value for one month is set to 500 [kWh], and the target value about upper limit of instantaneous value is set to 1 [kWh]. There are not set the target values about upper limit of integration value for one day and upper limit of integration value for one week. The items of the target value storage unit 16 are given in advance. On the other hand, the numerals of the target values can be set by a user. It is described later how to set the numeral of the target value into the target value storage unit 16.

TABLE 2

| item | | upper limit |
|---|---|---|
| integration value | one day | |
| | one week | |
| | one month | 500 [kWh] |
| instantaneous value | | 1 [kWh] |

In a case where the target value storage unit 16 is set therein a target value about the upper limit of instantaneous value of electricity, the determination unit 12 makes a decision about whether each instantaneous value of electricity (electricity for five minutes) exceeds the target value. The determination unit 12 decides that a triggering condition is satisfied (met), when the instantaneous value exceeds the target value. In a case where the target value storage unit 16 is set therein a target value about the upper limit of integration value of electricity, the determination unit 12 makes a decision about whether an integration value of electricity exceeds the target value every particular period such as every day, every week, every month, and the like. In this case, the determination unit 12 decides that a triggering condition is satisfied, when it elapses a predetermined period for obtaining the integration value of electricity (i.e., when it comes to a predetermined date and time).

Figure 3:
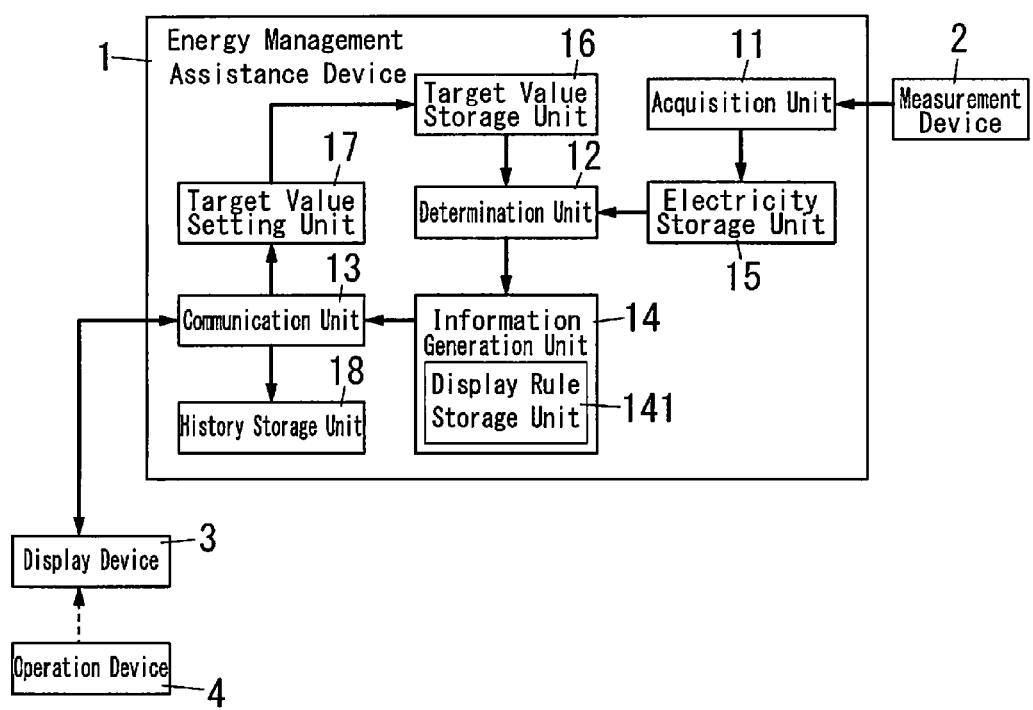
FIG. 3 is a block diagram illustrating a third embodiment.

The information generation unit 14 transmits display information related to the energy-related information to the TV 3, in response to the decision made by the determination unit 12 that the triggering condition of energy-related information is satisfied. The information generation unit 14 transmits display information to the TV 3 via the communication unit 13. The information generation unit 14 includes a display rule storage unit 141. The information generation unit 14 selects one of display information from the display rule storage unit 141. The display rule storage unit 141 prescribes display rules using the target values stored in the target value storage unit 16. Display rules are classified with respect to the target values stored in the target value storage unit 16, and the display rule storage unit 141 stores each display rule with corresponding display information, as shown in FIG. 3. The example shown in FIG. 3 uses, as the display rule, a good/bad rule that classifies the favorability about whether the energy-related information is favorable or not. The good/bad rule is a rule for determining whether it is favorable (beneficial) or unfavorable (indicates loss) for a user. In the example shown in FIG. 3, it is determined: to be beneficial when the value is equal to or less than a target value, since the energy can be saved; and to indicate loss when the value exceeds the target value, since the energy is highly consumed.

TABLE 3

| item | | upper limit | good/bad rule | display information | |
|---|---|---|---|---|---|
| | | | | top tier | second tier |
| integration value | one day | — | — | ... | ... |
| | one week | — | — | ... | ... |
| | one month | 500 [kWh] | 500 [kWh] or less | ○ | ... |
| | | | more than 500 [kWh] | x | ... |
| instantaneous value | | 1 [kWh] | 1 [kWh] or less | ○ | ... |
| | | | more than 1 [kWh] | x | ... |

In this example, upper limit of the integration value for month is set in the target value storage unit 16 at 500 [kWh]. The display rule storage unit 141 prescribes the good/bad rule using the upper limit as a target value, and stores display information with respect to each category of good/bad rule. For example, a category of "500 [kWh] or less" and a category of "more than 500 [kWh]" are set in advance in the display rule storage unit 141, and the display rule storage unit 141 stores display information with respect to each category of good/bad rule.

The above example is configured to make a decision about only whether or not the energy-related information meets the good/bad rule prescribed in the target value storage unit 16 using a target value, and in this case, the display information in the display rule storage unit 141 needs only two categories. With regard to the integration value of electricity for month, the display rule storage unit 141 of this example includes two categories of: attainment of the target value (i.e., a category of 500 [kWh] or less); and failure of the target value (i.e. a category of exceeding 500 [kWh]).

In this example, the display information include a symbol "○" indicating attainment and a symbol "x" indicating failure (as "first display information"). The categories for expressing attainment and failure of display information are distinguished by different symbols "○" and "x" in this example, but not limited thereto, and may be distinguished by different characters such as "OK" and "NG", different colors of a same symbol such as "☆" and "★" (in this case, "white star" indicates attainment and "black star" indicates failure), or the like. From a point of ease for recognition, it is preferable that the first display information has symbols only.

The information generation unit 14 selects display information from the display rule storage unit 141 to transmit it. In other words, the information generation unit 14 generates display information through the display rule storage unit 141. The display information transmitted by the information generation unit 14 is determined based on the decision about the good/bad rule of the display rule storage unit 141. That is, the determination unit 12 makes a decision about the integration value of electricity, which is obtained from the instantaneous value of electricity acquired by the acquisition unit 11, and the information generation unit 14 makes a decision about the good/bad rule of the display rule storage unit 141 in response to the decided result by the determination unit 12. The information generation unit 14 then selects one of display information corresponding to the decided result about the good/bad rule of the display rule storage unit 141, and transmits the selected display information to the TV 3 through the communication unit 13. The information generation unit 14 displays the display information on a region of not disturbing the view of the TV 3, such as an edge of a screen of the TV 3.

For instance, in the electricity storage unit 15 of the example of Table 1, the integration value has come to 501 [kWh] at Feb. 27, 2011, i.e., has exceeded "the upper limit of the integration value of electricity for month" stored in the target value storage unit 16 of Table 2. In this time, the determination unit 12 informs the information generation unit 14 that the value has exceeded the target value, and then the information generation unit 14 selects the symbol "x" (or "★") with referring the display rule storage unit 141. The communication unit 13 detects whether the TV 3 is turned on, and the information generation unit 14 transmits the selected display information to the TV 3 if the TV 3 is turned on.

As shown in Table 3, the display rule storage unit 141 prescribes the display information having a stratum structure. Display information of top tier (first display information) expresses favorability (good or bad, in this example) about the energy-related information, and display information of lower tier(s) (second display information) includes detailed information. The display information of lower tier is prescribed appropriately in the display rule storage unit 141, and examples of the display information of lower tier include: actual figure (numerical value) of the integration value of electricity; numerical value of the integration value of another month compared thereto; and transition of the integration values in a year. The display information of lower tier may be in the form of a message, a graph, or the like. The display information prescribed in the display rule storage unit 141 has a two-tier structure in Table 3, but may have a three-tier structure or more. It is preferable that the display rule storage unit 141 prescribes the display information so that the lower tier includes more detailed information.

For displaying the display information of lower tier on the TV 3, a user manipulates the remote control device 4 to transmit operation information requesting the display information of lower tier, under a condition where display information is displayed on the TV 3. When receiving the operation information through the communication unit 13, the management device 1 informs the operation information to the information generation unit 14. When receiving certain form of operation information from the communication unit 13, the information generation unit 14 transmits corresponding display information of lower tier to the TV 3.

As described above, the determination unit 12 makes a decision about whether the energy-related information acquired by the acquisition unit 11 meets a triggering condition, and the information generation unit 14 selects one of display information (display information of top tier; first display information) from the display rule storage unit 141 in response to the decided result by the determination unit 12 to display it on the TV 3. The management device 1 automatically (i.e., regardless of operation information from the remote control device 4) displays on the TV 3 the display information of top tier (first display information) when the energy-related information meets the triggering condition. A user can easily recognize about whether it is beneficial (good) or not (bad), since the display information which intuitively expresses the favorability about the energy-related information is displayed on the TV 3. If the user wants to see the information in more detail, the user only needs to manipulate the remote control device 4 in a certain manner, and thereby display information of lower tier (second display information) is displayed on the screen of the TV 3. The display information of top tier is preferably displayed on the edge of the screen of the TV 3. On the other hand, the display information of lower tier is displayed on a proper region of the screen of the TV 3 since the display information of lower tier has a larger amount of information.

The display information on the screen of the TV 3 is cleared from the screen of the TV 3 if: the remote control device 4 is manipulated to cancel the information; and it elapses a predetermined time after a final manipulation of the remote control device 4. For example, the management device 1 terminates the transmission of the display information (to the TV 3) when the communication unit 13 receives operation information for cancelling the display, and the communication unit 13 receives no operation information for a predetermined time. Thereby, the display information is made disappeared from the screen of the TV 3. Therefore, if the remote control device 4 is not manipulated for a predetermined time under a condition that only the display information of top tier is displayed, the display information is cleared from the screen of the TV 3 without displaying the display information of lower tier.

As described above, it is possible to interactively select display information using the screen of the TV 3 and the remote control device 4. The management device 1 is capable of being manipulated interactively, and accordingly the target value is set into the target value storage unit 16 according to an interactive manner using the screen of the TV 3 and the remote control device 4. The target value is preferably set by the process of: manipulating the remote control device 4 in a certain manner under a condition that the management device 1 is connected to the TV 3; being displayed a setting window for setting a target value into the target value storage unit 16; and setting a target value in response to manipulation of the remote control device 4 when the setting window is displayed. A target value setting unit 17 in the management device 1 executes the setting process, using the TV 3 as the display device and the remote control device 4 as the operation device, of setting the target value into the target value storage unit 16.

With regard to the target value about the instantaneous value of electricity, the display information (first display information) is displayed on the TV 3 upon an instantaneous value exceeding the target value. Examples of the target value set in the target value storage unit 16 includes integration value and instantaneous value of discharge amount of carbon dioxide, and electric bill, in addition to the integration value and the instantaneous value of electricity. The illustrated example includes a distributed power source 23, and therefore the energy-related information may include: information concerning a time point of switching between a state of selling electricity and a state of purchasing electricity (or whether the purchased electricity is smaller than a certain value, or whether the sold electricity is larger than a certain value); information concerning start and stop of power generation in the distributed power source 23; information concerning a time point of changing electricity rate.

The above description is made on the premise that the TV 3 is turned on. Note that, the management device 1 may be configured to temporarily store display information in a case that the TV 3 is not turned on, and to selectively display the display information from among the stored display information to display it when the TV 3 is turned on. The display information to be temporarily stored in the management device 1 is not limited, as long as it is not such information that is useful only when informed immediately (e.g., information concerning a time point of switching between the state of selling electricity and the state of purchasing electricity; information concerning start or stop of power generation; information concerning a time point of changing electricity rate; or the like). Such the information may be stored with a time limit, and may be deleted when the time limit comes.

With regard to temporary storing the display information, the management device 1 has a limit of storage capacity. Therefore, the management device 1 may be configured to delete the oldest display information regardless of whether the time limit has come, when storing new display information under a condition that the stored amount of information reaches the limit of the storage capacity. If pluralities of display information, which have not come to the time limits yet, are stored, they may be sequentially displayed according to a certain priority with a specified time interval when the TV 3 is turned on. It will be described in another embodiment about the technique for determining priority to the display information.

The management device 1 is formed of a programmable device such as a microcomputer, a PLD (Programmable Logic Device), or the like. The management device 1 performs the above functions by executing a program. It may be provided a program for functioning a general-purpose computer as the management device 1.

In case of using a display device other than the TV 3, an operation device may include a touch panel or a switch, instead of the remote control device 4. Furthermore, the operation device may be omitted (e.g., in a case of using a touch-panel type device which includes the display device and the operation device in one unit). The management device 1 may include a reception unit (not shown) configured to receive operation information (wireless signal) directly from a remote control device 4 (operation device) to transfer the operation information to the communication unit 13.

Second Embodiment

In the first embodiment, it is explained such examples: of using only the display information (first display information) that express favorable state or unfavorable state (good or bad) about the energy-related information; and that display information has a stratum structure which includes, as a top tier, the display information (first display information) expressing favorable state of unfavorable state (good or bad) about the energy-related information. On the contrary, in the present embodiment, it is explained such a technique that the display information of top tier (first display information) includes a plurality of levels which are determined according to the energy-related information, in addition to express favorable or unfavorable (good or bad) about the energy-related information. As shown in Table 4, the display rule storage unit 141 of the embodiment prescribes, as the display rule, a level determination rule that includes plural levels with respect to a target value stored in the target value storage unit 16.

TABLE 4

| item | | upper limit | level determination rule | display information top tier | display information second tiers |
|---|---|---|---|---|---|
| inte-gration value | one day | — | — | ... | ... |
| | one week | — | — | ... | ... |
| | one month | 500 [kWh] | 500 to 600 [kWh] | ★ | ... |
| | | | 600 to 999 [kWh] | ★★ | |
| | | | more than 999 [kWh] | ★★★ | |
| instantaneous value | | 1 [kWh] | 1 to 2 [kWh] | ★ | ... |
| | | | 2 to 3 [kWh] | ★★ | ... |
| | | | more than 3 [kWh] | ★★★ | |

In a region over 500 [kWh] with regard to the integration value of electricity for month, the display rule storage unit 141 prescribes, as the level determination rule, a display rule that includes plural levels (e.g., includes a level of 500 [kWh] to 600 [kWh], a level of 600 [kWh] to 999 [kWh], and a level of more than 999 [kWh]) in order to express an excess degree from the upper limit, instead of prescribing a display rule that includes a single level. In the display rule storage unit 141, display information is allocated with respect to the level determination rule. In the example of Table 4, display information includes display information of top tier (first display information) that can express not only whether the energy-related information indicates favorable state or unfavorable state (good or bad) but also the level of the goodness and/or badness. In detail, the display information of top tier shown in Table 4 indicates about whether the energy-related information is favorable or not by the color (white or black) of "star", and expresses the level by the number of the star. That is, visually different symbols are associated with respective levels of the first display information. The difference of the level of the goodness/badness is not limited to be expressed by the number of symbol, and may be expressed by the density of color of symbol, the difference of the shape of symbol, or the like.

The numerical value used for the level of the level determination rule (e.g., "600 [kWh]" for the integration value for month and "2 [kWh]" for the instantaneous value, in the example of Table 4) may be set into the target value storage unit 16 through the target value setting unit 17 by a user; or may be determined automatically based on the upper limit set into the target value storage unit 16. In the configuration of automatically determining the numerical value of the level based on the upper limit stored in the target value storage unit 16, the numerical value may be a rated value for the upper limit (e.g., "1.2 times the value of the upper limit"), or may be a value obtained by adding/subtracting a certain value from the upper limit (e.g., "upper limit+100 [kWh]").

The behavior of the embodiment is described below. For example, at 24:00 of the last day of a month, the determination unit 12 compares: an actual (measured) integration value of electricity for month; with the upper limit of integration value of electricity for month stored in the target value storage unit 16. In the following, it is assumed a case that the actual integration value is larger than the upper limit. The information generation unit 14 makes a decision, with referring the display rule storage unit 141, about the level of the actual integration value, and then extracts one of display information corresponding to the decided level. In the above example, e.g., one black star is derived if the actual integration value is 540 [kWh], and three black stars are derived if the actual integration value is 1001 [kWh]. In the example, display information of next lower tier (second display information) is represented by a message.

The actual integration value of electricity less than the upper limit indicates a state of attainment of the target. Therefore, in this case, it may be displayed only the information indicating "good" (for example, "○" or "☆") about the energy-related information, as with the first embodiment. Of course, the device may be configured to include plural levels according to degrees of attainment so that the level becomes higher as an increase of degree of the attainment of the target (i.e., the level becomes higher as an increase of difference between the upper limit and the actual value of electricity). In the example of Table 4, for example, the information generation unit 14 is configured so that: three white stars (☆☆☆) are derived when the actual integration value is 300 [kWh] or less; two white stars (☆☆) are derived when the actual integration value is 300 [kWh] to 400 [kWh]; and one white star (☆) is derived when the actual integration value is 400 [kWh] to 500 [kWh].

Other configurations and behaviors of the embodiment are similar with those of the first embodiment. In the embodiment, it is described such a configuration for expressing plural levels with regard to one type of display information. Note that, if there are some types of display information, different expressions may be allocated to different types of display information. In addition, expressions may be changed in each time the display information is selected. For example, one star, two stars, and three stars may be allocated to the value of electricity for day, for week, and for year, respectively. The display information of top tier (e.g., shape of symbol) may be changed with respect to each display. By virtue of changing the expression, it is possible to motivate a user to check the lower tier, since the user receives a fresh impression to the display information. Other configurations and behaviors are similar with those of the first embodiment.

Third Embodiment

In the first and second embodiments, the management device 1 displays the display information on the screen of the TV 3 in accordance with a produced order of the display information, in principle. The embodiment is configured to select the type of the display information to be displayed, based on a history whether the display information of lower tier has been accessed by the manipulation of the remote control device 4 when the display information of top tier was displayed on the TV 3. The information generation unit 14 of the embodiment is configured to generate a plurality types of display information that are respectively corresponding to a plurality of target values (e.g., the plurality of target values may be those determined with respect to: the integration value of electricity for month; the integration value of electricity for day; the integration value of discharge amount of carbon dioxide; and so on). As shown in FIG. 3, the management device 1 of the embodiment further includes a history storage unit 18. The history storage unit 18 stores, as a display history: information concerning whether the lower tier (second display information) has been accessed ("accessed" or "not accessed"); and information of accessed date and time, with respect to each type of display information, as shown in Table 5. Note that, "time" is not shown in the column of "display date and time" in Table 5.

TABLE 5

| permission for display | display information target value | display top tier | second tier | date and time | accessed or not |
|---|---|---|---|---|---|
| ○ | upper limit of integration value for day 20 [kWh] | ★ | ... | Feb. 1, 2011 | accessed |
|  |  |  | ... | Feb. 20, 2011 | accessed |
|  |  |  | ... | Mar. 10, 2011 | not accessed |
|  |  |  | ... | Apr. 1, 2011 | not accessed |
|  |  |  | ... | Apr. 20, 2011 | not accessed |
| ○ |  | ★★ | ... | Feb. 18, 2011 | accessed |
| x |  | ★★★ | ... | — | — |
| ○ | upper limit of carbon dioxide for day 2 [kg] | ★ | ... | Mar. 1, 2011 | not accessed |
|  |  |  |  | Mar. 20, 2011 | not accessed |
| x |  | ★★ | ... | — | ... |
| x |  | ★★★ | ... | — | ... |
| ○ | upper limit of electric bill for day 200 [Yen] | ★ | ... | Jan. 31, 2011 | not accessed |
| x |  | ★★ | ... | Jan. 28, 2011 | not accessed |
| x |  | ★★★ | ... | — | — |

The information generation unit 14 therefore enables to display different type of display information from which displayed at the last time, with referring the display history stored in the history storage unit 18. This configuration enables to avoid that the same type of display information is displayed on the TV 3 every time.

Priority can be given to each types of display information based on e.g., obtained information concerning whether the lower tier has been accessed by a user, using the display history stored in the history storage unit 18. The priority may be given to each type of display information so that a higher priority is applied to a type of display information which has been accessed more frequently (or which has higher ratio of "accessed"). In this configuration, the type of display information preferred by the user has a higher priority. The priority may be given to each type of display information so that a higher priority is applied to a type of display information which has been accessed less frequently (or which has higher ratio of "not accessed"). In this configuration, the type of display information that has not been accessed by the user has a higher priority.

Display order of the display information is preferably determined using the history stored in the history storage unit 18. In a configuration where a higher priority is given for a type of display information which has been accessed more frequently, it is possible to select the type of display information suited for the user. In a configuration where a higher priority is given for a type of display information which has been accessed less frequently, it is possible to display various types of display information to the user, since "the type of display information which has not been accessed usually by the user" will be selected and therefore type of display information can be differentiated from that displayed at the last time. This configuration can bring change s to the display information to be displayed, and it is possible to provide to the TV 3 the display information that keeps the user from being bored.

For example, when the integration value for day in the electricity storage unit 15 exceeds the upper limit of the integration value for day stored in the target value storage unit 16, the information generation unit 14 refers to the display rule storage unit 141 to extract display information (first display information) that corresponds to the integration value, and then display it on the TV 3. Then, the history storage unit 18 stores the information concerning whether the display information of lower tier (second display information) is accessed by a user through the manipulation of the remote control device 4. Note that, the history storage unit 18 also stores: display information that becomes displayable when the TV 3 is turned off; display information that has not been displayed on the TV 3 due to another display information is displayed on the TV 3; and the like. The history storage unit 18 stores such the display information as "waiting display information" and provides a symbol of "○" on the column of "permission for display".

When the TV 3 is turned on, the information generation unit 14 selects one of display information from among "waiting display information" if it becomes displayable the display information of top tier. In the example here, it is assumed that: the information generation unit 14 is configured to give a higher priority to the display information which has been accessed frequently; the history storage unit 18 stores the contents shown in Table 5; and actual integration value of electricity for day exceeds the upper limit of integration value for day (e.g., 20 [kWh]) at Apr. 21, 2011. The information generation unit 14 searches the information that has been displayed at previous time, with referring the column of "display date and time" of the history storage unit 18. In this case, it can be found that: the display information of top tier about the same target value with the present time has been displayed on the TV 3 at April 20; whereas the display information of lower tier has not been displayed (not accessed). The information generation unit 14 therefore selects a type of display information which has been accessed (e.g., electric bill) from among other types of displayable display information (such as discharge amount of carbon dioxide, electric bill and the like) stored in the history storage unit 18, and then displays first display information of the selected type of display information on the TV 3.

That is, the information generation unit 14 may be configured, if pluralities of displayable display information are stored in the history storage unit (storage unit) 18 on an occasion of transmitting first display information to the TV 3, to select one of display information from the history storage unit 18 in accordance with a priority determined based on past display history of second display information to transmit first display information of the selected display information to the TV 3.

The information generation unit 14 may be configured, if a plurality types of display information (e.g., display information of integration value of electricity for month as "first type of display information" and display information of integration value of electric bill for month as "second type of display information") are stored in the history storage unit 18 when transmitting a first display information to the TV 3, to preferentially select a type of display information which is different from that displayed at the last time based on a display history of second display information, and to transmit to the TV 3. In addition, if there are a lot of types of display information those are different from the type of display information displayed at the last time, the information generation unit 14 may select one of display information from the history storage unit 18 in accordance with a priority determined based on past display history of second display information.

With regard to determining the priority of second display information, the information generation unit 14 may be configured, if a plurality kinds of displayable second display information are stored in the history storage unit 18 when receiving operation information for requesting display information of lower tier (second display information) from the remote control device 4 under a condition where the display information of top tier (first display information) is displayed on the TV 3, to select one kind of second display information from the history storage unit 18 to transmit it to the TV 3 in accordance with a priority determined based on past display history of second display information. The information generation unit 14 may be configured to determine the kind of second display information to be displayed, irrespective of the type of the currently displayed first display information. For example, in a configuration where a higher priority is given for a kind of second display information which has been accessed more frequently, it is possible to select the kind of second display information preferred by the user. In a configuration where a higher priority is given for a kind of second display information which has been accessed less frequently, it is possible to display various kinds of second display information to the user, since "the kind of second display information which has not been accessed usually by the user" will be selected.

Other configurations and behaviors are similar with those of the first or second embodiment.

The information generation unit 14 may be configured to use another rule for selecting display information when there are pluralities of options about display information. For example, "the waiting display information" may be selected sequentially in the order that have been stored in the history storage unit 18. For example, "waiting display information" may be selected in the order based on "priority for selection" that has been given preliminarily according to the type of display information. In either case, such display information that has not been shown (not accessed) can be selected, without selecting the display information that has been already displayed.

The information generation unit 14 may be configured to preferentially display such display information that indicates favorable content (e.g., "☆") if the displayed information in the previous time is not favorable for a user (e.g., "★"), using the column of "display date and time" in the history storage unit 18. The information generation unit 14 may be configured to preferentially display such display information that indicates different level from the display information in the previous time, regardless of the content of display information. For example, if it has been displayed two white stars "☆☆" in the previous time, it is preferentially displayed three white stars "☆☆☆" or three black stars "★★★".

As described above, the embodiment includes the history storage unit 18 for storing display history of display information, and accordingly is capable of bringing changes the display information so as not a user to be bored and displaying the display information suited for a user. Other configurations and behaviors are similar with those of the first or second embodiment.

In the embodiments described above, determination for the triggering condition is made by the determination unit 12, and determination for good/bad rule or level determination rule is made by the information generation unit 14. However, the embodiments are not limited thereto, and e.g., the determination unit 12 may be omitted. That is, the information generation unit 14 may be configured to make a decision about both for the triggering condition and good/bad rule about the energy-related information, and to determine both the content to be displayed on the display device 3 and the timing of displaying the display information on the display device 3.

Although the present invention has been described with reference to certain preferred embodiments, numerous modifications and variations can be made by those skilled in the art without departing from the true spirit and scope of this invention, namely claims.

The invention claimed is:

1. An energy management assistance device comprising:
an acquisition unit configured to acquire energy-related information represented by a numerical value about the energy;
a determination unit configured to make a decision about whether the energy-related information acquired by the acquisition unit meets a triggering condition;
a communication unit to be connected to a display device and an operation device; and
an information generation unit configured to generate display information to be displayed on the display device,
wherein the display information has a stratum structure including first display information as a top tier and second display information, the first display information including at least two categories which express favorability about the energy-related information, the second display information being detailed information regarding the first display information and having a larger amount of information than the first display information, the second display information including plural kinds of information and having one or more tiers so that a lower tier includes more detailed information,
wherein the energy management assistance device further comprises a target value setting unit configured to set a target value about the energy-related information in response to operation information from the operation device,
wherein the information generation unit is configured to determine the favorability about the energy-related information based on whether the energy-related information exceeds the target value, and
wherein the information generation unit is configured:
(a) to transmit first display information to the display device in response to the decision made by the determination unit that the energy-related information acquired by the acquisition unit meets the triggering condition; and
(b1) to transmit second display information to the display device upon receiving operation information for requesting second display information from the operation device when the first display information is displayed on the display device, and
(b2) to terminate the transmission of the display information when the communication unit receives operation information for cancelling the display or when the communication unit receives no operation information for a predetermined time.

2. The energy management assistance device as set forth in claim 1,
wherein the information generation unit has functions of:
making a decision about whether the energy-related information acquired by the acquisition unit indicates favorable state or unfavorable state; and
determining a level of the energy-related information according to plural levels prescribed by a predefined level determination rule, and
wherein the information generation unit is configured to use, as the first display information, the information concerning the level of the energy-related information in addition to the information concerning whether the energy-related information indicates favorable state or unfavorable state.

3. The energy management assistance device as set forth in claim 2, wherein visually different symbols are associated with the respective levels of the first display information.

4. The energy management assistance device as set forth in claim 3, wherein the levels of the first display information are expressed by the number of the symbols.

5. The energy management assistance device as set forth in claim 1, further comprising a tangible memory for storing plural kinds of second display information,
wherein the information generation unit is configured, if a plurality kinds of displayable second display information are stored in the tangible memory when receiving operation information for requesting second display information from the operation device under a condition where the first display information is displayed on the display device, to select one kind of second display information from the tangible memory and to transmit it to the display device in accordance with a priority determined based on past display history of second display information.

6. The energy management assistance device as set forth in claim 1, further comprising a tangible memory for storing display information generated by the information generation unit,
wherein the information generation unit is configured, if pluralities of displayable display information are stored in the tangible memory on an occasion of transmitting first display information to the display device, to select one of display information from the tangible memory in accordance with a priority determined based on past display history of second display information, and to transmit first display information of the selected display information to the display device.

7. The energy management assistance device as set forth in claim 1,
wherein the information generation unit is configured to generate a first type of display information and a second type of display information with respect to a same energy-related information,
wherein each of the first type of display information and the second type of display information has a stratum structure including first display information as a top tier and second display information, the first display information including at least two categories which express the favorability about the energy-related information, the second display information including plural kinds of information so that the lower tier includes more detailed information,
wherein the energy management assistance device further comprises a tangible memory for storing the first type of display information and the second type of display information generated by the information generation unit, and
wherein the information generation unit is configured, if various types of display information are stored in the tangible memory on an occasion of transmitting first display information to the display device, to preferentially select a type of display information which is different from a type of display information displayed last time based on past display history of second display information, and to transmit first display information of the selected type of display information.

8. The energy management assistance device as set forth in claim 1,
wherein a television set is used as the display device, and
wherein the information generation unit is configured to transmit the first display information to the display device so that the first display information is shown on a part of a screen of the display device.

9. An energy management assistance system comprising:
an information provision device configured to provide energy-related information represented by a numerical value about the energy;
a display device configured to make a display in response to inputted display information;
an operation device configured to generate operation information in response to manipulation of a user; and
an energy management assistance device connected to the information provision device, the display device and the operation device,
wherein the energy management assistance device comprises:
an acquisition unit configured to acquire energy-related information from the information provision device;
a determination unit configured to make a decision about whether the energy-related information acquired by the acquisition unit meets a triggering condition;
a communication unit connected to the display device and the operation device; and
an information generation unit configured to generate display information to be displayed on the display device,
wherein the display information has a stratum structure including first display information as a top tier and second display information, the first display information including at least two categories which express favorability about the energy-related information, the second display information being detailed information regarding the first display information and having a larger amount of information than the first display information, the second display information including plural kinds of information and having one or more tiers so that a lower tier includes more detailed information,
wherein the energy management assistance device further comprises a target value setting unit configured to set a target value about the energy-related information in response to operation information from the operation device,
wherein the information generation unit is configured to determine the favorability about the energy-related information based on whether the energy-related information exceeds the target value, and
wherein the information generation unit is configured:
(a) to transmit first display information to the display device in response to the decision made by the determination unit that the energy-related information acquired by the acquisition unit meets the triggering condition; and
(b1) to transmit second display information to the display device upon receiving operation information for requesting second display information from the operation device when the first display information is displayed on the display device, and
(b2) to terminate the transmission of the display information when the communication unit receives operation information for cancelling the display or when the communication unit receives no operation information for a predetermined time.

10. A program product comprising machine readable instructions when executed by a computer to serve it as an energy management assistance device, the energy management assistance device comprising: an acquisition unit configured to acquire energy-related information represented by a numerical value about the energy; a determination unit configured to make a decision about whether the energy-related information acquired by the acquisition unit meets a triggering condition; a communication unit to be connected to a display device and an operation device; and an information generation unit configured to generate display information to be displayed on the display device,
wherein the display information has a stratum structure including first display information as a top tier and second display information, the first display information including at least two categories which express favorability about the energy-related information, the second display information being detailed information regarding the first display information and having a larger amount of information than the first display information, the second display information including plural kinds of information and having one or more tiers so that a lower tier includes more detailed information,
wherein the energy management assistance device further comprises a target value setting unit configured to set a target value about the energy-related information in response to operation information from the operation device,
wherein the information generation unit is configured to determine the favorability about the energy-related information based on whether the energy-related information exceeds the target value, and
wherein the information generation unit is configured:
(a) to transmit first display information to the display device in response to the decision made by the determination unit that the energy-related information acquired by the acquisition unit meets the triggering condition; and
(b1) to transmit second display information to the display device upon receiving operation information for requesting second display information from the operation device when first display information is displayed on the display device, and
(b2) to terminate the transmission of the display information when the communication unit receives operation information for cancelling the display or when the communication unit receives no operation information for a predetermined time.

* * * * *